(12) United States Patent
Rana et al.

(10) Patent No.: US 7,360,198 B2
(45) Date of Patent: Apr. 15, 2008

(54) TECHNOLOGY DEPENDENT TRANSFORMATIONS FOR CMOS IN DIGITAL DESIGN SYNTHESIS

(76) Inventors: Amar Pal Singh Rana, P.O. Box 2279, Sunnyvale, CA (US) 94087; Nirmal Singh, P.O. Box 2279, Sunnyvale, CA (US) 94087

(*) Notice: Subject to any disclaimer, the term of this patent is extended or adjusted under 35 U.S.C. 154(b) by 0 days.

(21) Appl. No.: 11/285,267

(22) Filed: Nov. 22, 2005

(65) Prior Publication Data
US 2006/0075375 A1 Apr. 6, 2006

Related U.S. Application Data

(62) Division of application No. 10/172,448, filed on Jun. 17, 2002, now Pat. No. 7,039,882.

(51) Int. Cl.
*G06F 17/50* (2006.01)

(52) U.S. Cl. .................... 716/18; 716/3

(58) Field of Classification Search .............. 716/2, 716/4
See application file for complete search history.

(56) References Cited

U.S. PATENT DOCUMENTS

| | | | |
|---|---|---|---|
| 6,237,127 B1* | 5/2001 | Craven et al. ............ 716/6 |
| 6,253,361 B1 | 6/2001 | Buch |
| 2002/0053063 A1 | 5/2002 | Bhattacharya et al. |
| 2002/0069396 A1 | 6/2002 | Bhattacharya et al. |

* cited by examiner

*Primary Examiner*—Stacy A Whitmore

(57) ABSTRACT

The present invention pertains to automated technology dependent transformations for CMOS digital design synthesis resulting in a combination of CMOS interconnected standard-cells from a target CMOS library being mapped and transistor-level representation of the input design specification. The transistor level type and portion to be represented at the transistor level representation is chosen by a user. The transistor sizing and evaluating the combination of said transistor-level representation and standard-cell mapping are performed iteratively to meet delay, size and power constraints for CMOS.

6 Claims, 6 Drawing Sheets

TECHNOLOGY DEPENDENT TRANSFORMATIONS FOR CMOS IN DIGITAL DESIGN SYNTHESIS

CROSS-REFERENCE TO RELATED APPLICATIONS

This is a divisional application of parent utility application Ser. No. 10/172,448 filed on Jun. 17, 2002 by the same inventors, filed pursuant to election, based on the office action of May 14, 2004, such parent application has been allowed and now constitutes U.S. Pat. No. 7,039,882 for the elected species, transformations for Silicon-On-Insulator (SOI) ICs, while this divisional application is for the unelected species, transformations for CMOS ICs, of the parent application.

BACKGROUND OF THE INVENTION

1. Technical Field

The invention relates to technology dependent transformations for design automation and more particularly to technology dependent CMOS transistor level transformations where user specifies the portion or portions of the input design specification to be represented at the transistor level and the transistor level type e.g. cascode family, NORA logic etc. It also relates to SOI gate or transistor-level synthesis.

2. Glossary of Terms

A cluster is the single organizational component of a logic synthesis database. It has input and output terminals, which allow connection to other clusters by nets. Each cluster is designated by a technology type e.g. CMOS push pull cascode family or SOI dynamic pre-charge evaluation logic, which may be a primitive or may reference a definition in terms of other clusters. Thus, a hierarchy of clusters can be used and an instance of a high-level cluster type, may be treated as a single cluster or expanded. These clusters are mapped into target library cells or transistor level representation. A cluster may be modified into fewer or more clusters with a set of transformations to meet constraints e.g. number of maximum fan-ins to a cluster or maximum number of series stack of inputs.

A Component Instantiation implies a block of hierarchy within a design entity containing a unique instance of another section of design defined by another design entity. In VHDL or Verilog, etc. a component instantiation statement and corresponding specification may be used to define the instance of a gate from a technology library and identify its connections, respectively.

Control Logic tends to be characterized by complex, unpredictable interrelationships of signals. Such logic usually contains a large amount of redundancy, which decreases testability, requires more connections than necessary, increases area and produces long and slow paths.

A Covering Algorithm, sometimes called mapping or technology mapping is the implementation of a generic Boolean network using a library of technology dependent gates/transistor clusters.

Data Flow Logic is characterized by highly parallel and well-known or well-understood combinatorial algorithms, such as adders and multipliers, and may include the most critical timing path for the design.

Expressions are the product of parsing register transfer level statements. They correspond one for one with source level statements and are stored as a string of tokens on a cluster. They are in prefix form (postfix form would be equivalent), i.e. in the string form of a parse tree.

Digital design Synthesis is used to mean the synthesis of a technology dependent model from a register transfer level description or from interconnected functional blocks to result in standard-cell mapped design from a target library, or result in a combination of standard-cell mapped design from a target library and a transistor level representation for part or all of the input design specification.

A Netlist is a detailed interconnection listing of clusters in the target technology from which automated logic diagrams may be produced for integrated circuit fabrication.

Primitives are technology independent gates, e.g. AND gates, ORs, NOTs, etc.

A Register Transfer Level Description is a high level abstraction of a logic design. It comprises logic functions to be implemented in an integrated circuit. Interface constraints and a technology database may be specified. An example of a language that may be used for RTL description is VHDL or Verilog, etc.

PI is Primary Inputs, PO is primary outputs, inputs to a cluster coming from neighboring clusters are internal inputs.

ALU is Arithmetic Logic Unit, a portion of the Microprocessor.

.lib is the well known Synopsys library format.

CMOS is complementry Metal Oxide Semiconductor technology.

SOI is silicon-on-Insulator (IC) integrated circuit where the insulator may be oxide, nitride, carbide, of Silicon or single crystal Sapphire or the like.

NORA is no race condition CMOS transistor level design.

FSCL is Folded Source Coupled Logic.

Cascode family is represented by Differential Cascode Voltage or current switch, push pull cascode logic and well known to integrated circuit designers. A dual rail logic is when both input and it's complement is utilized in a cluster for transistor level representation.

Transformation is a term for a collection or suite of programs which operate on expressions or manipulate clusters representing boolean functions and their connections.

3. Description of the Related Art

The design of very large scale integration (VLSI) circuits presents a number of challenges beyond those encountered in the design and development of smaller integrated circuit chips. A longer manufacturing cycle, tighter timing requirements, shorter machine cycle, and a larger number of gates per designer all must be overcome while meeting a short development time budget.

Logic synthesis is a process used to convert a technology independent logic description into a netlist which may be directly implemented in a technology and thereby speed circuit development. Logic synthesis addresses many problems, one of them being the conversion of a more-or-less technology independent register transfer level (RTL) design model to a technology dependent model. Computer programs that perform logic synthesis are known, however these computer programs generally use mathematical techniques that do not have general solutions. Faced with the lack of a rigorous mathematical solution, logic design engineers have had to develop techniques which may not be mathematically rigorous but which do produce acceptable results. Such techniques generally involve compromises and practical limitations. Logic synthesis can also be used to generate a technology dependent model from a very high level (e.g. higher than RTL) description or to convert a technology dependent design to a different technology.

This invention relates to the design of integrated circuits (ICs) in general, and in particular to an automated system and process for creating highly optimized gate and transistor-level building blocks that incorporate design-specific optimization goals and yields significant benefits for most design environments, such as, COT/COL, ASICS, ASP, etc. for SOI and for user chosen blocks to be represented in CMOS transistor level design during technology dependent digital design synthesis. For CMOS and SOI user also selects the type of transistor level representation type.

Over the last four decades, design and manufacturing of ICs has evolved into a multi-billion dollar industry. IC designs can be broadly classified into two major categories: (i) storage designs, which store digital data; and (ii) logic designs, which manipulate digital data.

The present invention described herein is applicable to the category of logic ICs or parts thereof, that deal broadly with data manipulation and several sub-categories thereof, viz., ASICs, ASSPs, COT/COL, etc.

The proliferation of digital ICs and the diversity of applications using ICs have led to the development and use of various types of metrics for evaluating the cost and quality of developed ICs. Die size, performance (i.e., speed), and power consumption have evolved as three of the most commonly used metrics for measuring the quality of IC designs. Other metrics, such as, for example, noise, signal integrity, reliability, etc. are gaining in importance. Time-to-market or design cycle time, and expected sales volume have evolved as two other commonly used business metrics. It is generally observed that the time-to-market period is steadily decreasing for nearly all digital ICs.

The importance of quality metrics, such as those mentioned above, is generally application-dependent, and thus varies from one design to another. Two of the most commonly used combinations of metrics are: (i) performance and power, and (ii) die size and power.

Due to ever-increasing time-to-market pressures, highly automated IC design processes have been developed that can be broadly categorized as: (i) fully pre-fabricated, highly programmable component-based design process (e.g., FPGA, etc.); (ii) partially pre-fabricated platform (e.g., gate array) based design processes, which, upon completion, require only that the metal layers be fabricated, and (iii) design processes that do not rely on any pre-fabricated components or platforms, but instead, use fixed building blocks (standard cells) with pre-defined schematic structure and layout, and fully customizable interconnections between the blocks wherein at the completion of the design process, all components (layers) in the design need to be fabricated from scratch. Among these, the last category of IC designs typically offers the highest performance, the smallest die size, and the lowest power among designs created using automated tools. In order to limit the complexity of the design process to manageable levels, traditionally, standard cell libraries are used in such automated design flows. Numerous automated IC design tools, e.g., simulation, synthesis, place-and-route, extraction, verification, etc., suitable for utilizing with standard cell libraries, have been developed. The synthesis tools accept as input a given design description in some suitable format (e.g., register-transfer level (RTL), behavioral, etc.), and generate a netlist. The netlist is simply an interconnection of the pre-defined cells in the standard-cell library. Place-and-route tools create a layout utilizing the layouts of the pre-defined standard cells such that the interconnections between the cells, as specified in the netlist, are preserved. Place-and-route tools also take into account the detailed timing issues that arise from the actual location of the various cells in the layout. A typical flow diagram of a process for creating IC designs using such standard-cell libraries is shown in FIG. 1.

A key problem with the existing approach of automated IC design processes is that designers, using synthesis tools, are forced to use components from a static, pre-defined standard-cell library of cells developed to be applicable to a wide variety of digital ICs. As a result, the cells tend to be relatively small and general-purpose. Standard-cells, such as basic Boolean gates: AND, OR, NAND, NOR, XOR, XNOR, AND-OR-INVERT, OR-AND-INVERT, MUX, etc. However, for a given design, the forced use of such pre-defined standard cells leads to poor quality in the final design as compared to full-custom (hand-crafted) IC design processes and judged by the aforementioned quality metrics. Particular attention has been drawn to this fact by recent comparisons of designs created by automated flows versus designs created using a full-custom, heavily manual design process.

Therefore, although automated tools and flows speed up the design creation process, the relatively poor quality of resultant designs as judged against the quality that can be achieved with a manual re-design of the same part, has major cost and business implications. Increased die-size and increased power consumption by as much a factor of 10 or more are two major and obvious such implications. Reduced performance of the automated design, by as much as a factor of 2, also has significant implications in the marketplace. Even a cursory comparison of handcrafted designs to automatically generated design shows a noticeable difference in the usage patterns of various layers in the physical design. Handcrafted designs tend to use all the layers, including diffusion and polysilicon layers, very effectively and efficiently, while automatically generated designs tend to use diffusion and polysilicon layers relatively sparsely while using the metal layers profusely. Recently, it has been noted by many designers and researchers that this profusion of metal interconnects in automatically generated designs constitutes an increasing problem (and bottleneck) in terms of performance and power consumption, as IC designs into deep-sub-micron geometries approaching 0.10 micron or less.

Prior attempts at improving the quality of automatically generated designs, over the past two decades, have focused primarily on automatic layout synthesis. A key constraint faced by automatic layout synthesis methods is that they are primarily appropriate for layouts of relatively small transistor-level designs. Attempts to apply the same automatic layout synthesis methods to the creation of VLSI designs—popularly known as silicon compilation in the early 1980's was pursued without such success for many years, and was eventually dropped.

More recently, a body of work has been reported in the area of automated creation of transistor-level designs. These efforts are primarily academic in nature, with a heavy focus on the use of pass-transistor logic (PTL). The vast majority of industrial standard-cell based designs continue to use static CMOS style of design, due to various problems inherent in PTL. Key among such problems is the loss of one Vt (threshold voltage of a transistor, modified by appropriate body effects) while passing a signal (high or low voltage) through pass transistors, which can easily lead to slow/improper functioning of subsequent stages of transistors driven by a pass transistor. A relatively smaller portion of the efforts that apply to static CMOS module generation are focused on simply minimizing transistor count in the transistor-level modules created. The prior automated IC design processes do not take into account performance of the resultant modules as well as a host of real-life constraints that must be taken into account while creating transistor-level modules used in actual designs. Such real-life constraints include (i) tolerable delays from individual inputs to output(s) of modules created at the transistor level, (ii) maximum depth of n- and p-transistor stacks in the modules created, (iii) tolerances on transition times of the signals at the outputs of modules created, (iv) desired drive-strength of resultant module, (v) limits on capacitive loads at inputs of the module created, etc.

SOI designs are affected by floating body effects where the delay of a gate or a transistor level design continues to change over long period of simulation time or from testing fabricated SOI cells over long times. This can lead to functional failure if not accounted for.

SUMMARY OF INVENTION

The patent application 20020053063 Bhattacharya, Debashis et. al utilizes automated dynamic transistor level design where gate approach does not meet timing constraints in CMOS ASIC design. The realistic improvement of such an approach is considerably diminished in each of the automated steps for not being fully capable to match the manual optimizations due to algorithmic deficiencies, unacceptable CPU run time and memory needed during: the input design specification technology independent logic minimization stage, transistor level stages clustering, transistor sizing algorithms, local automated dynamic precharge and evaluation clock generation at the high frequencies needed and automated layout of dynamic clusters and subsequent placement and routing of such dynamic clusters having widely differing aspect ratios with the rest of standard cells for CMOS ASIC design resulting in overall questionable improvement to meet timing, size or power constraints. With lower dielectric material between the interconnects, cross-coupling is lowered resulting in lower interconnected delay, diminishing the need of automated gate sizing as taught in U.S. Pat. No. 6,253,361 of Buch, Premal and eliminating the need for automated CMOS transistor level design as taught in patent application 20020053063 to automatically substitute for weak portions of gate design flow.

In light of the shortcomings of automated CMOS IC design processes discussed above, the present invention focuses on the technology dependent transformations in CMOS digital design synthesis resulting in a combination of CMOS interconnected standard-cells from a target CMOS library being mapped or transistor-level representation for all or portion of the input design specification, the transistor level type being chosen by a user in the form of complex gate, ratioed logic or pseudo NMOS style, cascode static, dynamic and current-mode families, NORA and other CMOS design styles familiar to those skilled in the art of CMOS design. The user also making the decision as to where to use these transistor level designs, such as ALU and familiar to those skilled in the art of CMOS IC design, transistor sizing and evaluating the combination of said transistor-level representation or standard-cell mapping iteratively to meet a plurality of delay, size and power constraints for CMOS.

In light of the shortcomings of automated SOI IC design processes discussed above, the present invention focuses on accounting for the floating body effects in many ways, such as running very long period of input simulation vectors or providing input vectors to an SOI fabricated design from nanoseconds to seconds to hours to days and getting the maximum delays or minimum delays as the case may be for a given SOI gate or transistor level design and using such delay in a target library (say in lib format of Synopsys) as well or utilizing such delay information in the automated technology dependent transformations in Silicon-On-Insulator (SOI) during the digital design synthesis, resulting in interconnected SOI standard-cells from a SOI target library where the maximum or minimum delays of the library cells have been accounting due to floating body effects, including floating body effects affecting delays over long periods of simulation time or from testing fabricated SOI cells over long times or from testing fabricated SOI cells over long times and gate/body or gate/source connections for various cells in the library, or SOI transistor level representations or a combination thereof, the SOI transistor level representations utilized are accounted for floating body effects by using cascode family of representation or precharging intermediate nodes in the stack for dynamic SOI transistor-level representations or gate/body or gate/source connections or manipulating the transistor stacks to minimize parasitic effects familiar to those skilled in the art of SOI transistor level design, sizing and evaluating the standard-cell mapping and transistor-level representation iteratively for all or portion of the input design specification to meet a plurality of delay, size and power constraints for SOI. The transistor level representation can be sized and interfaced using existing automated layout synthesis tools for SOI.

The present invention pertains to automated technology dependent transformations in Silicon-On-Insulator (SOI) during the digital design synthesis, the transformations include the steps of receiving input design specification in the form of technology independent specification or interconnected structural blocks, where the structural blocks have been described as a library of standard-cells; performing the technology dependent transformations during the digital design synthesis, resulting in interconnected SOI standard-cells from a SOI target library accounting for floating body effects, including floating body effects affecting delays over long periods of simulation time or testing over long times on fabricated SOI library cells, or SOI transistor level representations or a combination thereof, transistor sizing and evaluating the standard-cell mapping or transistor-level representation for all or portion of the input design specification iteratively to meet delay and power constraints for SOI; or during technology dependent transformations in CMOS digital design synthesis resulting in a combination of CMOS interconnected standard-cells from a target CMOS library being mapped or transistor-level representation for all or portion of the input design specification, the transistor level type and portion or portions of the input design specification to be represented at the transistor level representation being chosen by a user, transistor sizing and evaluating the combination of said transistor-level representation or standard-cell mapping iteratively to meet delay, size and power constraints for CMOS

DETAILED DESCRIPTION OF THE INVENTION

The present invention pertains to automated technology dependent transformations in Silicon-On-Insulator (SOI) during the digital design synthesis. The transformations include the steps of receiving input design specification in the form of technology independent specification or interconnected structural blocks, where the structural blocks have been described as a library of standard-cells. The technology dependent transformations performed during the digital design synthesis, result in interconnected SOI standard-cells from a SOI target library, accounting for floating body effects, including floating body effects affecting delays over long periods of simulation time or testing over long times on fabricated SOI library cells, or SOI transistor level representations or a combination thereof, transistor sizing and evaluating the standard-cell mapping or transistor-level representation for all or portion of the input design specification iteratively to meet delay and power constraints for SOI; or during technology dependent transformations in CMOS digital design synthesis resulting in a combination of CMOS interconnected standard-cells from a target CMOS library being mapped or transistor-level representation for all or portion of the input design specification. The transistor level type and portion or portions of input design specification to be represented at the transistor level representation being chosen by a user; transistor sizing and evaluating the combination of said transistor-level representation and standard-cell mapping iteratively to meet delay, size and power constraints for CMOS.

The present invention pertains to technology dependent transformations capable of creation and optimization of CMOS design-specific, complex functional blocks, hereinafter designated design-specific cells. A fuller understanding of the overall organization of an IC design process using CMOS design-specific cells created in accordance with the present invention for designing high-quality, design-specific ICs can be had by referring to FIG. 2. The process of generating the design-specific IC design building blocks is represented as design-specific cell generation in FIG. 3. The CMOS transistor level representation type and portion or portions of the input design specification to be represented at the transistor level representation chosen by the user as shown in processes [203, 209, 302] in FIG. 3 in detail, the starting point is register transfer language and user identifying the portion or portions of the input design specification to have transistor-level representation or structural netlist by referring to FIG. 2 process [203, 209].

Figure 4:
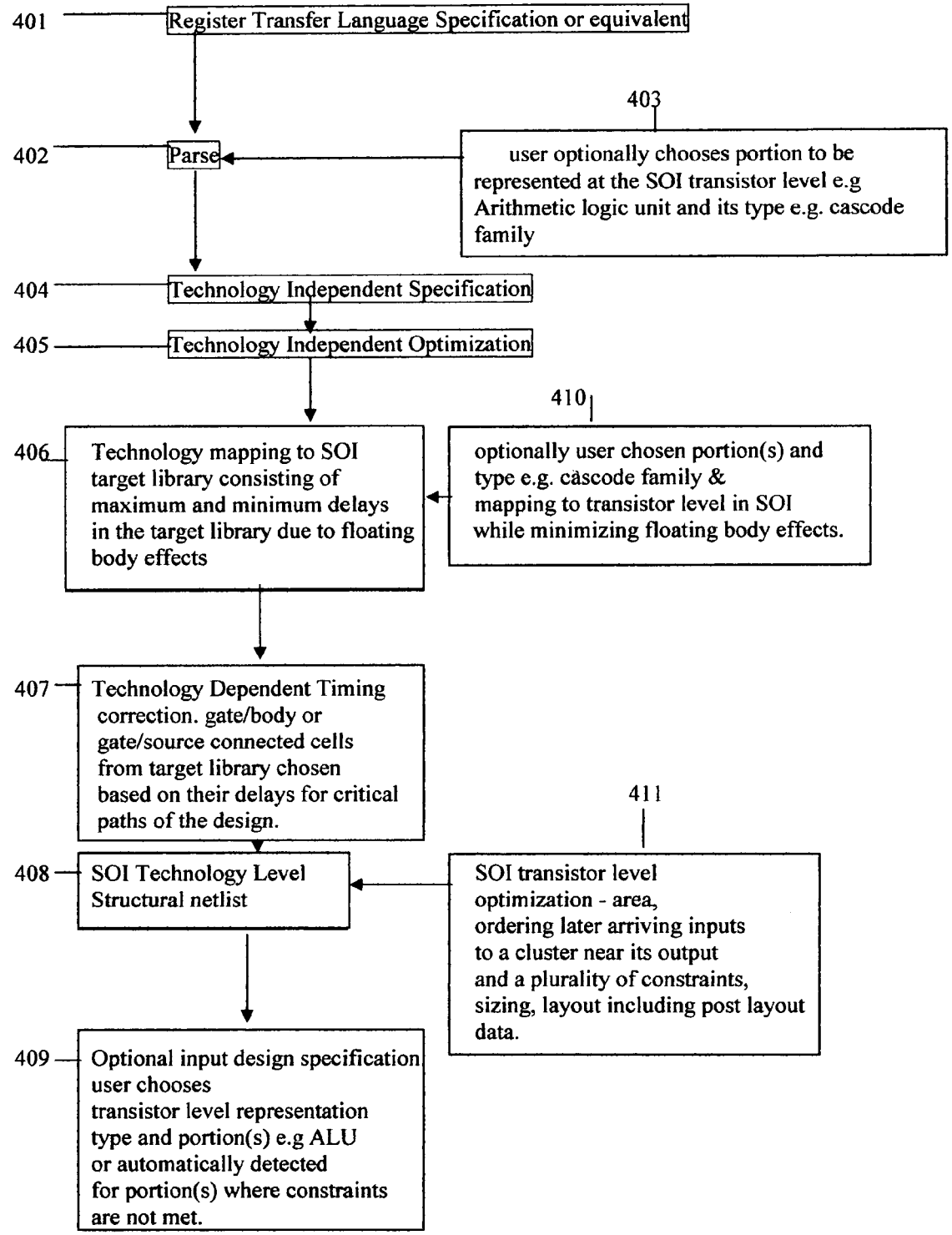
FIG. 4 is a flow diagram depicting a process for designing digital SOI integrated circuits in accordance with the present invention where the technology dependent is conducted with reference to a target SOI library where delays for long simulation time or delays from fabricated SOI standard cells accounting for floating body effects for maximum delays or minimum delays for various SOI standard cells (say in .lib format of Synopsys or similar way to input the maximum or minimum delays for SOI related to floating body effects).
Figure 5:
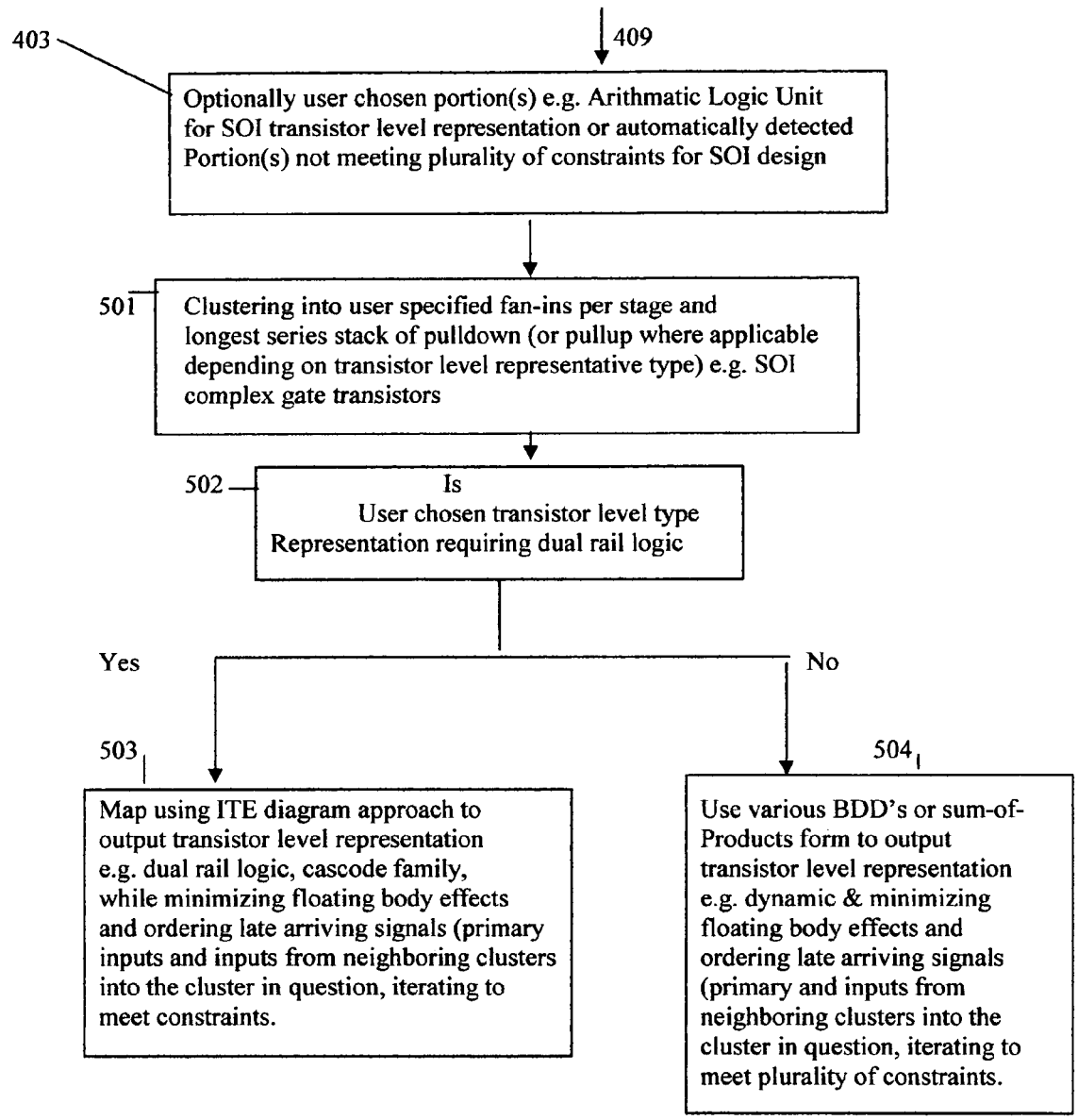
FIG. 5 is a flow diagram depicting a process for designing digital logic circuits, utilizing dynamically created, design-specific transistor level SOI representation in accordance with the present invention; The transistor level SOI representation is simulated for long times accounting for delays from floating body effects whether maximum delays or minimum delays have resulted for various SOI transistor level representations. The dynamically clusters are created by user specified maximum fanins for each cluster or maximum series stack height. Then mapping to transistor level netlist based on transistor level representation type, e.g. dual rail logic where both input and it's complement is required e.g. cascode family using ITE data structure and for dynamic precharge/evaluation style logic using sum of products form. Iterating to meet the user specified constraints while accounting for floating body effects where applicable and using gate/body or gate/source connections to meet user specified constraints.
Figure 6:
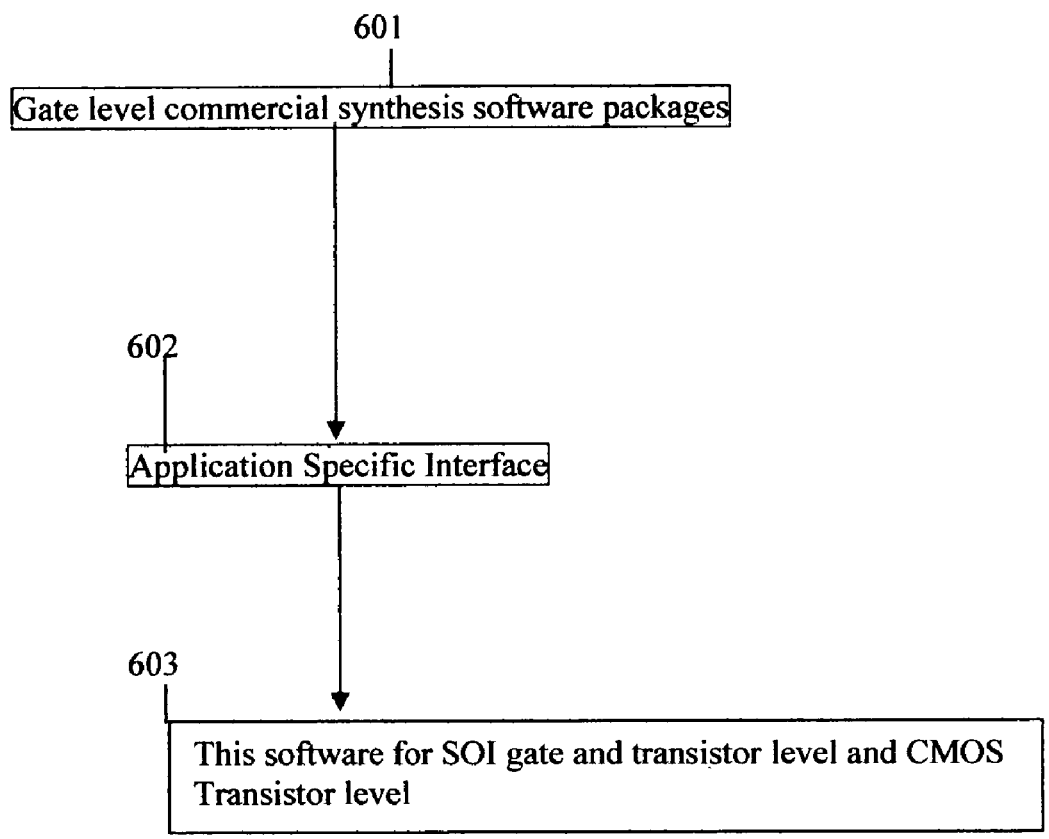
FIG. 6 shows that client software may be combined as a dynamic or static client software library with existing master software programs such as Synopsys, Magma, Cadence, Synplicity, etc. as a single executable or as independent executables where the necessary Application Specific Interface provides data exchange between the client software with the mater software and client software provides the technology dependent transformations at the CMOS transistor level representation and SOI gate mapping to target SOI library or SOI transistor level representation as well.

The present invention also pertains to automated technology dependent transformations in Silicon-On-Insulator (SOI) during the digital design synthesis, the transformations include the steps of receiving input design specification in the form of technology independent specification or interconnected structural blocks, where the structural blocks have been described as a library of standard-cells; performing the technology dependent transformations during the digital design synthesis, resulting in interconnected SOI standard-cells from a SOI target library accounting for floating body effects, including floating body effects affecting delays over long periods of simulation time or testing over long times on fabricated SOI library cells, referring to FIG. 4, or SOI transistor level representations or a combination thereof, transistor sizing and evaluating the standard-cell mapping and transistor-level representation for all or portion of the input design specification iteratively to meet delay and power constraints for SOI, referring to FIG. 5.

Figure 3:
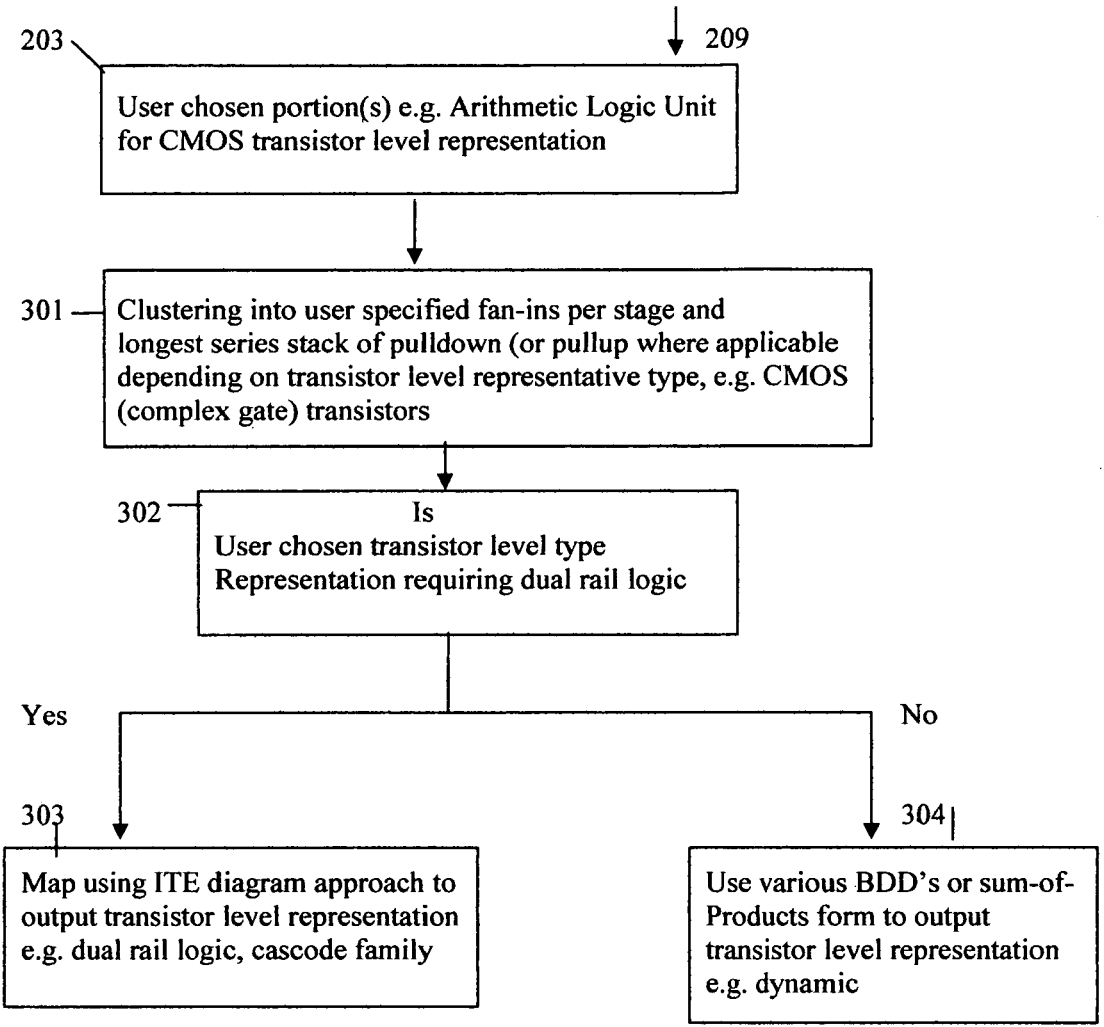
FIG. 3 is a flow diagram depicting a process for designing digital logic circuits, utilizing user specified CMOS type and usage for dynamically created, design-specific cells in accordance with the present invention where the input design specification is chosen by user from structural description or RTL and creating clusters of user specified maximum fanins for each cluster or maximum series stack height. Then mapping to transistor level netlist based on transistor level representation type, e.g. dual rail logic where both input and it's complement is required e.g. cascode family using ITE data structure and for dynamic precharge/evaluation style logic using sum of products form. Iterating to meet the user specified constraints.

In CMOS clustering process 301 in FIG. 3, prior to the invocation of the creation of the CMOS design-specific cell(s), the functionality of each target design-specific cell is identified from the target description, the transistor level representation type in the form of complex gate, ratioed logic or pseudo NMOS style, cascode static, dynamic and current-mode families, NORA and other CMOS design styles familiar to those skilled in the art of CMOS design is chosen by the user as well as portion or portions of RTL or structural netlist to be represented at the transistor level. Performance, area, and other performance and design constraints for the target IC are considered and used to partition the target IC design into functional "clusters" using clustering process 301 in FIG. 3.

In clustering process for SOI 501 of FIG. 5, prior to the invocation of the creation of the SOI design-specific cell(s), the functionality of each target design-specific cell is identified from the target description, the transistor level representation type in the form of complex gate, ratioed logic, style, cascode static, dynamic and current-mode families, NORA and other CMOS SOI design styles familiar to those skilled in the art of SOI design is chosen by the user as well as portion or portions of RTL or structural netlist to be represented at the transistor level may be chosen by the user or automatically detected. Performance, area, and other performance and design constraints for the target SOI IC are considered and used to partition the target IC design into functional "clusters" using clustering process 501 of FIG. 5 and accounting for floating body effects if applicable or gate/body or gate/source connections to meet user constraints.

For SOI, the automated clustering process in FIG. 5, and the master optimization control 403, 408, 409 may involve (i) identifying cells in regions of criticality of the SOI target design, with large propagation delay; (ii) identifying cells in the regions of criticality of the target design, with larger transition delay; (iii) identifying cells in the regions of criticality of the target design. Subsequent to detection of such weaknesses in the SOI library, the process of the present invention is used to create design-specific cells that eliminate the problems detected, and thereby may enrich The SOI library for the specific design being targeted as referenced in FIG. 5 and accounting for floating body effects or gate/body or gate/source connections as well.

Figure 1:
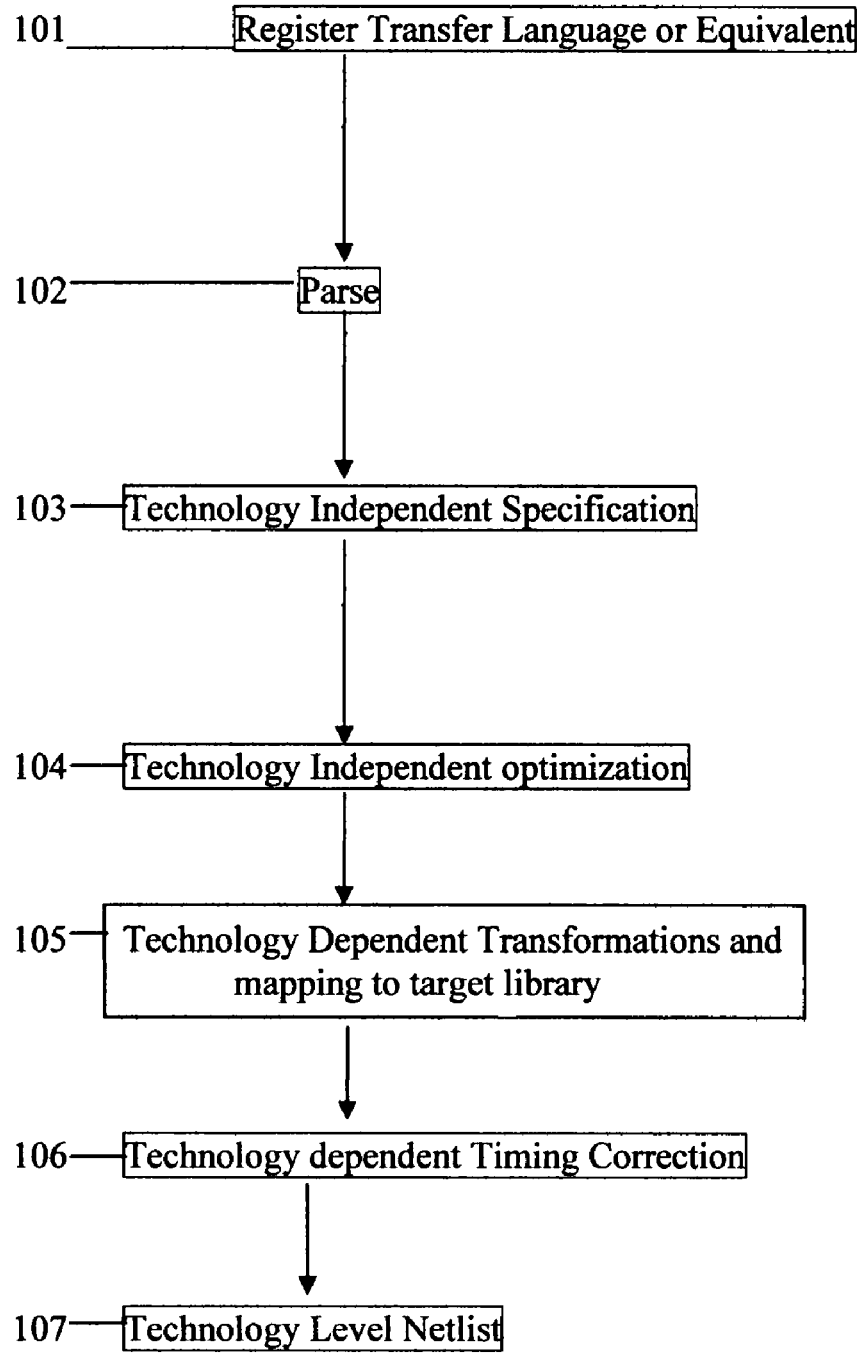
FIG. 1 is a block diagram of a conventional IC design process for standard-cell based CMOS design of digital logic circuits during digital design synthesis.
Figure 2:
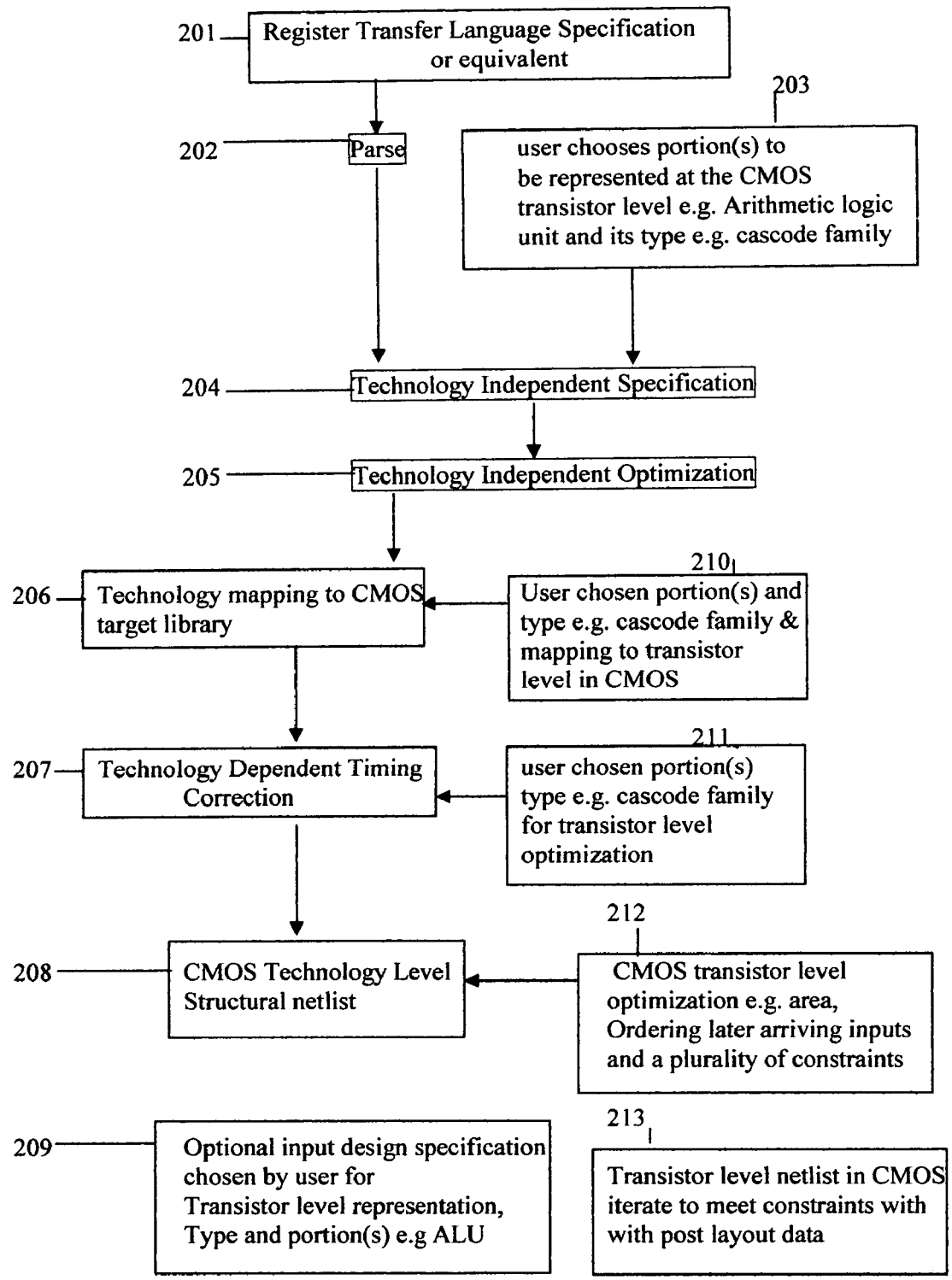
FIG. 2 is a flow diagram depicting a process for designing digital logic circuits, utilizing user specified CMOS type and usage for dynamically created, design-specific cells in accordance with the present invention where the input design specification is chosen by user from RTL description or optionally where input design specification may be chosen from structural netlist.

The functional clusters in an IC design, partitioned based on the constraints of the specific IC design, are used by design-specific cell Generation process in FIGS. 2 and 3. Accordingly, the design-specific cells generated by design-specific cell generation process in FIGS. 2 and 3 are specifically designed for the subject IC design. In this manner, a highly customized IC design can be implemented using design-specific cells as shown in the automated IC design process of FIG. 3 for CMOS where user specifies portion or portions of RTL or structural CMOS netlist to be represented at the transistor level for CMOS and transistor level representation type for CMOS in the form of complex gate, ratioed logic or pseudo NMOS style, cascode static, dynamic and current-mode families, NORA and other CMOS design styles familiar to those skilled in the art of CMOS design as shown in processes 203, 209 and 301. The user also making the decision as to where to use these transistor level designs, such as ALU as shown in processes 203, 209, 302 etc. and familiar to those skilled in the art of CMOS IC design.

In one aspect of the present invention, the process is aimed at bridging the gap in quality between SOI IC designs created using automated tools and custom, handcrafted SOI IC designs. As FIGS. 4 and 5.

Clustering process in FIG. 3 for CMOS and FIG. 5 for SOI performs a detailed analysis of the IC design to be created (i.e., the target design), and identifies target cell-level clusters (partitions of interconnected cells) that will be represented by optimized design-specific cells. The functional "clusters" identified by clustering process 301 for CMOS and 501 for SOI invokes design-specific cell generation process 302, 303 and 304 for CMOS and 502, 503 and 504 for SOI. The context in which each generated design-specific cell will be used is analyzed in clustering process 301 for CMOS and 501 for SOI for the purpose of determining a set of performance and area constraints that will be used in generating the design-specific cells by design-specific cell generation process 302, 303 and 304 for CMOS and 502, 503 and 504 for SOI.

It is noted that clustering process in FIG. 3 for CMOS and FIG. 5 for SOI can invoke a uniquification and compaction process 302, 303 and 304 for CMOS and 502, 503 and 504 for SOI. Uniquification and compaction process 50 operates to minimize the number of functionally unique design-specific cells generated for use in the implementation of the IC design. Further, if a pre-defined standard-cell library is available (e.g., as one of the inputs 206 for CMOS and 406 for SOI to the user interface), uniquification step 206 for CMOS and 306 for SOI can be employed iteratively to identify near or exact matches (depending on the tolerance of the IC or design-specific cell design process). Design-specific cells having equivalent matches in the available standard-cell library can thus be replaced by standard-cells. Also, the number of distinct cells used is minimized for SOI accounting for SOI floating body effects. For CMOS the user specified blocks such as portion or portions of ALU for transistor-level representation.

A typical embodiment of the overall process of the present invention is depicted in FIG. 3 for CMOS and FIG. 5 for SOI. The SOI IC design-specific cell generation process starts with technology dependent transformations, step 503 or 504 for SOI and 303 or 304 for CMOS create transistor-level design representations of the set of design-specific cells identified and partitioned in step 403 or 409 of FIG. 4. Step 501 for SOI and 301 for CMOS provides the capability for: (i) ensuring functional correctness of the resultant transistor-level design; (ii) meeting design targets, for example, performance (e.g., speed), area, power dissipation, etc. for the design-specific cells generated for implementation in the IC design, in context of the intended implementation of the design-specific cell; (iii) meeting other implementation constraints, such as, but not limited to, maximum length of interconnects of through the Pulldown or Pullup stack of transistors forming in the design-specific cell, the required signal output (i.e., drive strength) for the design-specific cell, desired input capacitive load of the design-specific cell, etc.; (iv) minimizing the number of transistors in the design-specific cells, subject to the design of the IC design; (v) sizing the transistors of the transistor-level netlists for the design-specific cells, as necessary; and (iv) introducing systematic redundancy at the transistor-level, if necessary, to meet the design target(s) such as, for example, timing, power, etc. for the design-specific cells. For CMOS user specifies transistor level representation type and portion or portions such a ALU to be represented at the transistor level.

Optionally, for SOI layout synthesis step 411 is used to obtain layouts for the created transistor-level design-specific cells. Though not explicitly shown, sizing optimization of the transistors is preferably employed in layout synthesis step 411, if appropriate. An objective for layout synthesis step 411 is compatibility with a standard-cell library blocks such that the design-specific cells created can be interfaced with standard-cells. The compatibility of the design-specific cells and the standard-cells enables the final IC design to be highly customized (i.e., design-specific cells) and yet flexible enough to use standard-cells where possible or desired.

Fast characterization steps 407, 503 and 504 for SOI is performed to obtain an estimate of the timing characteristics of the design-specific cell since the design constraints are known and have in fact been used as the basis for generating the design-specific cells. Technology dependent transformations for SOI steps 406, 407, 408, 409, 410 optional layout synthesis step 411, and fast characterization steps 407, 503 and 504 are repeated, as necessary, to meet target design criteria, such as for example, the design-specific cell's timing, area and power constraints for each design-specific SOI cell.

While FIG. 3 for CMOS and FIG. 5 for SOI depicts an exemplary iterative embodiment a method for generating a design-specific cell in accordance with the present invention, other variations of the process can be devised to suit specific design optimization goals without departing from the scope of these teachings. Such variations include, but are not limited to, techniques such as simulated annealing, genetic algorithms, etc. to avoid being stuck in "local optima" during the transistor-level design generation and optimization process in FIG. 3 for CMOS and FIG. 5 for SOI. For CMOS user chooses the transistor level representation type and portion or portions such as ALU.

Also, a branch-and-bound search process can be used to avoid the local optima. Branch-and-bound search optimization involves (i) exploring alternative choices, to determine which choice is better, since such determination cannot be made a priori (i.e., branching), and (ii) ruling out some possible choices as being "obviously bad" (i.e., bounding). Design-specific cell generation process In FIG. 3 for CMOS and FIG. 5 for SOI preferably concludes with a detailed characterization step 411 once the generated design-specific cells meet the design specifications in steps 503 and 504. At detailed characterization steps in FIG. 5 for SOI, the design-specific cell generation process. In FIG. 5 is capable of characterizing the generated design-specific cells using highly accurate transistor-level simulation tools, such as SPICE or static transistor level timing tools, to obtain precise signal propagation and timing information about the cells. This is possible since the design-specific cells have preferably been generated using practical, implementation dependant design constraints in the generation and optimization of the design-specific cells for SOI. For CMOS user chooses the transistor level representation type and portion or portions such as ALU.

As previously mentioned, the SOI design-specific cells are preferably formatted to be compatible with libraries of standard-cell SOI IC blocks. Thus, the generated design-specific cells available at step 401 to 504 for SOI, can preferably be interfaced together with an SOI IC design process SOI standard-cell library. The capability to combine design-specific cells generated in accordance with these teachings, and standard-cell SOI IC building blocks enhances the ability of the automated SOI IC design process to meet the design-specific criteria of the SOI IC being designed thereby. The set of design-specific cells, either alone or in combination with standard-cells, provides an optimally tuned set of building blocks for the target SOI IC design. The optimality is preferably measured against accepted and definable (i.e., quantifiable) metrics, such as but not limited to, die size, power consumption, noise, signal integrity, testability, etc.

In contrast to the SOI design-specific cells disclosed herein, conventional SOI standard-cell libraries consist of a collection of relatively low-complexity blocks presumably designed for wide application in a variety of designs. Therefore, SOI standard-cell libraries are not functionally optimized on a per building block (i.e., cell) level for any specific SOI IC design. Moreover, cells in a conventional SOI standard-cell library are fixed. That is, conventional SOI standard-cells, in contradistinction to the teachings herein, cannot be modified to adapt to the specific implementation context of the SOI IC design for which they are used.

Processes 406 to 504 of the present invention controls the functionality of the design-specific cells created therein, by incorporating the constraints and conditions of the SOI IC design into the generation of the design-specific cells. Consequently, the quality of the target SOI IC design achieved by the present invention, as measured in terms of the aforementioned metrics such as die size, performance, power consumption, signal integrity, etc., is significantly improved as compared to previous automated SOI IC design processes.

With reference to FIG. 2 for CMOS and FIG. 4 for SOI, it is noted that inputs to transistor mapping processes may be, (i) a set of structural cell-level netlists item 209 for CMOS and 409 for SOI, and (ii) a set of performance and area constraints for each individual netlist provided to the IC design process as part of inputs. As mentioned above, the set of cell-level netlists, and the set of IC design constraints are identified and functionally associated with a functional "cluster" in clustering process 301 for CMOS and 501 for SOI (see FIG. 3 or FIG. 5). The set of cell-level netlists can be obtained either by partitioning the output of a conventional logic synthesis tool, or deduced from a higher-level description language (e.g., RTL or behavioral) representation of the target IC design Circuit e.g. step 205 for CMOS and 405 for SOI. For CMOS user chooses both the transistor level representation type and portion or portions such as ALU to be represented at the transistor level.

The important steps of SOI design-specific cell generation process include: (i) technology dependent transformations for transistors level representation step 410; (ii) fast characterization step 411 (pre-layout) that incorporates implementation context of the design-specific cells; (iii) transistor sizing; (iv) accurate characterization step 503 and 504; (v) the optional layout synthesis with transistor sizing, via an (optional) interface with an independent layout synthesis tool step 503 and 504; (vi) post-layout characterization step 504 and 504 if layout synthesis step 110 is performed; (vii) generation of interface(s) to interface the design-specific cells into a SOI standard-cell based design flow.

SOI Design-specific cell generation process 405 may take in as an input a netlist composed of Boolean gates, or more generally, cells in a traditional standard cell library. The output of the generation process 411, 503 or 504 is a netlist composed of transistors that implements the same function as the original cell-level netlist. The output netlist of generation process 411, 503 or 504 may have, (i) a different interconnection topology for the transistors, (ii) different number of transistors (typically fewer), and (iii) different sizing of the transistors, as compared to the topology, transistor numbers and sizing of the gates or cells in the netlist provided at the input of design-specific cell generation process.

SOI technology dependent transformations at gate level mapping accounting for floating body effects is depicted in 406 in FIG. 4 and for transistor level in 501 to 504 in detail in FIG. 5. The process of mapping out the interconnection of transistors for the SOI design-specific cell generated in generation processes 403, 409, 501 to 504 includes four major sub-steps as shown. In particular, the steps of transistor level SOI mapping process include, (i) transistor netlist generation step 403, 504, (ii) evaluation step 403, 504; (iii) transistor topology alteration step 403, 504, and (iv) preliminary transistor sizing step 411. Known algorithms and heuristics may be can be used in the sub-steps of mapping process. For example, transistor netlist generation process 503, 504 and transistor topology alteration process 210 could use various known transistor netlist generation techniques based on the use of Binary Decision Diagrams (BDD's).

CMOS technology dependent transformations 203, 209, 301 to 304 are depicted in greater detail in FIG. 3. The process of mapping out the interconnection of transistors for the CMOS design-specific cell generated in generation process includes the following major sub-steps as shown. In particular, the steps of mapping process include, (i) user selecting transistor level representation type 203, 209 (ii) user selecting portions or portions of input design specification e.g. ALU 203, 209 to be represented at the transistor level representation (iii) transistor netlist generation step 303, 304. Known algorithms and heuristics may be can be used in the sub-steps of mapping process. For example, transistor netlist generation process 303, 304 could use various known transistor netlist generation techniques based on the use of Binary Decision Diagrams (BDD's).

A BDD is a well-known data structure based on acyclic directed graphs used to represent functions commonly encountered in digital circuits. Recent research has demonstrated techniques to derive transistor netlist structures using BDD's. Another variety of BDD referred to as ordered BDD (OBDD), imposes a rule that variables encountered during tracing any path through the structure will always follow a fixed order. ROBDD is a special case of OBDD's, where there is exactly one (unique) ROBDD for each unique function (i.e., ROBDD's are canonical).

However, existing mapping algorithms suffer from the key limitation that they are geared towards working with very simple objectives, such as minimizing transistor count. Moreover, existing methods suffer from very high computational complexity. In accordance with the present invention, the optimization criteria and design requirements for the generated design-specific cell is not static (i.e., change per IC design) but is varied and complex due to the fact that the specification criteria may be inter-related in the practical, implementation situations considered by the present invention.

Consequently, new design processes have been developed in accordance with the present teachings for SOI to provide for the generation of highly efficient transistor-level implementations of design-specific cells, given clusters including interconnection of standard-cells, Boolean gates, or simply a Boolean function description of the cluster output(s). A flow diagram depicting the design-specific cell mapping process 403, 409, 501 to 504 for generating a design-specific cell(s) given a cluster input is provided in FIG. 5. The output may have one or more outputs depending on the function mapped via mapping process. Mapping process preferably incorporates the strengths of BDD-based transistor netlist generation techniques, while minimizing the computation complexity, and allowing for enforcement of important real-world constraints including accounting for floating body effects where applicable and gate/body or gate/source connections.

CMOS Transistor netlist generation process 410, 411, 2-3, 209, 301 to 304 preferably starts with the invocation of a plurality of algorithms to generate the CMOS design-specific cells that may ultimately be used in the CMOS IC design. The algorithms used produce the netlists may include a path-based transistor network synthesis algorithm in which paths leading to terminal nodes 0(low) and 1 (high) or to primary inputs (PI) or inputs coming from neighboring clusters (internal inputs) to source or drain serving as terminal nodes in the ROBDD representation of the functionality of the given cluster, are used to deduce the pulldown and pullup networks that define a CMOS implementation of the given cluster's functionality. The netlist may be generated using a transistor network synthesis algorithm that constructs the transistor netlist in a bottom-up manner, by traversing the ROBDD representation of the given cluster. The netlist may be generated employing a transistor network synthesis algorithm that uses ROBDDs, whereby different root-to-terminal paths in ROBDDs can have input variables appearing in different orders looping through various input ordering to minimize area/transistor count and discarding non-optimal ROBDD's, thus resulting in much more compact transistor implementations of the design-specific cell.

The SOI netlist may also be generated using a transistor network synthesis algorithm that employs "If-then-else (ITE) diagrams" that are a generalization of the BDDs, in that the branching at a vertex can be done not only on an input variable of the function, but also on arbitrary sub-functions. Consequently, transistor networks generated using ITE diagrams may be even more compact than those generated using ROBDDs. Such networks can also be optimized for performance targets easily, by incorporating the proper decomposition directly into the ITE diagram. Another possible method of possibly generating the netlists is to use a transistor network synthesis algorithm both for SOI and CMOS that uses gate-level logic optimization techniques, such as SIS, (the Sequential Interactive Synthesis program for designing digital circuits, developed at University of California, Berkeley) to generate efficient transistor networks for certain types of functions. Namely, functions having a with small sum-of-products (SOP) or factored form representation. Gate-level logic optimization techniques are particularly suited for operating with small SOP or factored form representations since neither are efficiently represented by any of the other above methods. For SOI floating body effects need to be taken into account for transistor level representation. For CMOS and SOI ITE diagram utilization for transistor netlist generation is primarily for representation requiring both inputs and their respective complements, e.g. Folded Source Coupled Logic, Cascode family, e.g. Push Pull Cascode Logic. SOI further requiring to accommodate for floating body effects.

For SOI target SOI library mapping during technology dependent transformations the focus is on accounting for the floating body effects in many ways, such as running very long period of input simulation vectors or providing input vectors to an SOI fabricated design from nanoseconds to seconds to hours to days and getting the maximum delays or minimum delays as the case may be for a given SOI gate or transistor level design and using such delay in a target library as well or utilizing such delay information in the automated technology dependent transformations in Silicon-On-Insulator (SOI) during the digital design synthesis, resulting in interconnected SOI standard-cells from a SOI target library where the maximum or minimum delays of the library cells have been accounting due to floating body effects, including floating body effects affecting delays over long periods of simulation time or from testing fabricated SOI cells over long times or from testing fabricated SOI cells over long times or gate/body or gate/source connections for various cells in the library, or SOI transistor level representations or a combination thereof, the SOI transistor level representations utilized are accounted for floating body effects by using cascode family of representation or pre-charging intermediate nodes in the stack for dynamic SOI transistor-level representations or gate/body or gate/source connections or manipulating the transistor stacks to minimize parasitic effects familiar to those skilled in the art of SOI transistor level design, sizing and evaluating the standard-cell mapping or transistor-level representation iteratively for all or portion of the input design specification to meet a plurality of delay, size and power constraints for SOI. The transistor level representation can be sized and interfaced using existing automated layout synthesis tools for SOI.

The SOI topology alteration process 303, 304 that is invoked if the netlist generation process of step does not result in a netlist meeting the requirements of the SOI IC design, explores multiple alternative topology implementations of the functionality of a given cluster. For example topology alteration process may include using a variable reordering in the decision diagram (ROBDD, or ITE) representations of the cluster. Topology alteration process may also use multiple decomposition methods for the function such as, but not limited to, Boole-Shannon, Kronecker, Roth-Karp, Positive Davio, Negative Davio, and Ashenhurst techniques.

Some exemplary results and uses of the design-specific cell generation process encompassed by the present invention are illustrated in FIG. 3 for CMOS and FIG. 5 for SOI illustrate a design-specific cell that results when a portion of an IC design is mapped to transistors, with the primary goal being performance optimization. In this case, there late arriving primary inputs (PI) are ordered close to the output of the cluster, last arriving primary input being closest to the output of the cluster and earliest arriving primary input away from the output of cluster. If inputs to a cluster also come from neighboring clusters (internal inputs), I.e. other than primary inputs, these inputs are ordered according to their overall relative delay as well and given preference over primary inputs for which longer arrival times have not been specified. The remaining non-critical inputs are then ordered so as to give minimum area for this performance optimization mode. Optimizing the cluster by using design-specific cells generated in accordance with the present invention, as shown in FIG. 5 steps 503 and 504 with floating body effects accounted for SOI and steps 303 and 304 for CMOS.

Although the above description is has been described primarily in the context of the static SOI family of logic circuits, the transistor-level network generation process (including its sub-steps), are applicable for the pulldown or the pullup network individually, if the target SOI IC design implementation calls for using another family of SOI circuit design as the user way desire e.g. dynamic, cascode family, etc.

It should be appreciated that the SOI layout synthesis process and post-layout characterization process of SOI design-specific cell generation process 411 depicted in FIG. 4, can be performed separately, or coupled in an iterative manner with other aspects of design-specific cell generation process, in order to create a highly optimized layout of the SOI transistor-level netlist derived from the generation process.

In SOI layout synthesis step, the SOI transistor-level netlist is translated to a layout for use by a target SOI IC fabrication process. The present invention observes the constraints imposed on the layout synthesis by the intended SOI IC fabrication process technology. The layout synthesis preferably uses automated layout synthesis techniques and tools. Layout synthesis is preferably further augmented with transistor sizing, that is distinct from transistor sizing step since post-layout estimation of parasitics is much more accurate than pre-layout estimation. In this manner, the transistors can be fine-tuned in the final layout.

SOI Post-layout characterization step operates closely with layout synthesis. It is preferable that characterization step employ a highly accurate device-level simulator such as SPICE or variations thereof or static timing software at the transistor level or gate and transistor level. It is possible that other tools, including macro-modeling tools with sufficient accuracy, and new characterization tools and processes developed for this invention, will be used for the pre-layout characterization. The inputs to the post-layout characterization are (i) layouts generated in the layout synthesis, (ii) models of the devices used in the layout, and (iii) importantly, the context of use for each SOI design-specific cell in the specific design for which the design-specific cell is created. The results of characterization can be used to drive the layout synthesis, with altered constraints, and the steps can be repeated until, for example, the target timing characteristics of the SOI design-specific cell(s) being designed and evaluated, are satisfied.

In one approach, client software may be combined as a dynamic or static client software library with existing master software programs such as Synopsys, Magma, Cadence, Synplicity, etc. as a single executable or as independent executables where the necessary Application Specific Interface provides data exchange between the client software with the mater software and client software provides the technology dependent transformations at the CMOS transistor level representation and SOI gate mapping to target SOI library or SOI transistor level representation as well.

It should be understood that the foregoing description is only illustrative of the invention. Various alternatives and modifications can be devised, without departing from the invention. For example, the methods of the present invention can be implemented by an automated computer system programmed to control the execution of these teachings. Accordingly, the present invention is intended to embrace all such alternatives, modifications and variances that fall within the scope of the appended claims.

While the invention has been particularly shown and described with reference to a preferred embodiment, it will be understood by those skilled in the art that various changes in form and detail may be made therein without departing from the spirit and scope of the invention

The invention claimed is:

1. Automated technology dependent transformations for CMOS digital design synthesis, comprising steps of: receiving input design specification in the form of technology independent specification or interconnected library of standard-cells, transistor level type and portion or portions of said input design specification to be represented at the transistor level representation being chosen by a user; performing the technology dependent transformations in the digital design synthesis, resulting in a combination of CMOS interconnected standard-cells from a target CMOS library being mapped and transistor-level representation for all or portion of the input design specification; and transistor sizing and evaluating the combination of said transistor-level representation and standard-cell mapping to iteratively to meet delay, size and power constraints for CMOS.

2. The method of claim 1, wherein said input design specification is from a group consisting of a netlist representation, a descriptive language representation, or a standard-cell representation used in a CMOS IC design process.

3. The method of claim 1, wherein said user-selected transistor level representation type consists of complex gate, ratioed logic, pseudo NMOS style, cascade static, dynamic, current-mode families and NORA for CMOS design styles with user specified maximum fanins or maximum series stack height.

4. The method of claim 1, wherein said CMOS technology dependent transformation generates a transistor netlist based on at least one netlist generation algorithm and evaluating said generated transistor netlist based on at least one design specification for CMOS said transistor level representation utilizes an If-Then-Else method for dual rail logic or ulitizes a Binary Decision Diagrams approach or Sum of Products approach for a non-dual rail transistor level representation.

5. The method of claim 1, wherein said automated technology dependent transformations comprises optimization by said transistor sizing of said transistor level representation for CMOS by simulation using stimulus for said transistor level representation or by static timer.

6. The method of claim 1, wherein said automated technology dependent transformations for CMOS are combined as a dynamic or static software library or binary executable with existing software programs from commercial software as a single executable or as independent executables; wherein said binary executable invokes said technology dependent transformations for said transistor level representation.

* * * * *